(12) United States Patent
Yasuda et al.

(10) Patent No.: US 12,389,575 B2
(45) Date of Patent: Aug. 12, 2025

(54) POWER CONVERSION APPARATUS

(71) Applicant: DENSO CORPORATION, Kariya (JP)

(72) Inventors: Shin Yasuda, Kariya (JP); Hiroshi Taki, Kariya (JP); Takuro Nakaoka, Kariya (JP)

(73) Assignee: DENSO CORPORATION, Kariya (JP)

( * ) Notice: Subject to any disclaimer, the term of this patent is extended or adjusted under 35 U.S.C. 154(b) by 119 days.

(21) Appl. No.: 18/217,870

(22) Filed: Jul. 3, 2023

(65) Prior Publication Data

US 2023/0354563 A1    Nov. 2, 2023

Related U.S. Application Data

(63) Continuation of application No. PCT/JP2022/004999, filed on Feb. 9, 2022.

(30) Foreign Application Priority Data

Feb. 19, 2021    (JP) .................................. 2021-025043

(51) Int. Cl.
*H05K 7/20* (2006.01)

(52) U.S. Cl.
CPC ..... *H05K 7/20909* (2013.01); *H05K 7/20145* (2013.01); *H05K 7/20272* (2013.01); *H05K 7/2039* (2013.01); *H05K 7/20927* (2013.01)

(58) Field of Classification Search
CPC ............. H05K 7/1432; H05K 7/20145; H05K 7/20218; H05K 7/20254; H05K 7/20272; H05K 7/2039; H05K 7/20409; H05K 7/20509; H05K 7/20854; H05K 7/20872; H05K 7/209; H05K 7/20909; H05K 7/20927; H05K 7/20936; H05K 7/20945; H01L 23/36–3677; H02K 5/22; H02K 9/19

See application file for complete search history.

(56) References Cited

U.S. PATENT DOCUMENTS

| | | | |
|---|---|---|---|
| 7,579,805 B2* | 8/2009 | Saito .................. | H05K 7/20927 318/800 |
| 2014/0198449 A1* | 7/2014 | Osada ..................... | H01L 24/34 361/689 |
| 2015/0152987 A1* | 6/2015 | Ishikawa ............ | H05K 7/20927 285/350 |
| 2016/0105083 A1 | 4/2016 | Ishimaru et al. | |

(Continued)

FOREIGN PATENT DOCUMENTS

JP    2007-294655 A    11/2007

*Primary Examiner* — Amir A Jalali
(74) *Attorney, Agent, or Firm* — Oliff PLC

(57) ABSTRACT

In a power conversion apparatus, at least one intra-casing cooling passage is a passage through which a coolant for cooling at least a power converter flows, and is arranged in a casing. At least one extra-casing cooling passage communicates with the at least one intra-casing cooling passage and is drawn out from an inside of the casing. The at least one extra-casing cooling passage is disposed not to be in contact to the outer periphery of the casing. The power converter is arranged to be cooled by the coolant flowing through the at least one intra-casing cooling passage, and a heat exchanger and the casing are arranged to be subjected to cooling air, resulting in the heat exchanger and the casing being cooled by the cooling air.

7 Claims, 5 Drawing Sheets

(56) References Cited

U.S. PATENT DOCUMENTS

2018/0219488 A1*  8/2018  Nakamura ......... H05K 7/20936
2018/0269682 A1*  9/2018  Specht .................. H02B 1/565
2018/0286781 A1*  10/2018  Yoshihara ......... H01L 23/49548

\* cited by examiner

POWER CONVERSION APPARATUS

REFERENCE TO RELATED APPLICATIONS

This application is a bypass continuation application of currently pending international application No. PCT/JP2022/004999 filed on Feb. 9, 2022 designating the United States of America, the entire disclosure of which is incorporated herein by reference, the internal application being based on and claiming the benefit of priority from Japanese Patent Application No. 2021-25043 filed on Feb. 19, 2021.

TECHNICAL FIELD

The present disclosure relates to power conversion apparatuses.

BACKGROUND OF THE INVENTION

For example, Japanese Patent Application Publication No. 2016-77118 discloses a motor apparatus. The motor apparatus includes a motor unit and a power conversion apparatus, such as an inverter, that are integrally installed in a single casing. The power conversion apparatus generates alternating-current (AC) power that drives the motor unit. The power conversion apparatus includes a power converter, a capacitor, and a controller that includes a control circuit. The power converter includes power devices, such as switches, which are controlled to be turned on or off. A larger amount of heat given off by the power converter, which is one of these power converter, capacitor, and controller, results in the power converter being more likely to increase its temperature.

From this viewpoint, the motor apparatus disclosed in the patent publication is configured such that (i) the power converter, which is a main heat-generating component, and (ii) the capacitor and controller, each of which is a lesser heat-generating component, are located in respective different spaces that are physically isolated from one another. This suppresses an increase in temperature of one of the spaces in which the control circuit is located; the control circuit has a relatively lower heat resistance.

Additionally, cooling passages provided between the motor unit and the power converter reduce heat dissipation from the motor unit to the power converter.

SUMMARY OF THE INVENTION

An increase in temperature of a coolant, which circulates through the cooling passages, due to, for example, an increase in the amount of heat given off by the motor unit and/or an increase in the environment temperature around the motor apparatus may result in the casing of the motor apparatus being heated. This may increase the temperature inside one of the spaces in which the control circuit is located. This may result in devices included in the control circuit becoming susceptible to damage.

From this viewpoint, it has been considered to further increase the cooling capability in the casing. This increase in the cooling capability in the casing may require that heat dissipators, such as heat dissipating fins, be additionally installed in the casing and/or the size of the casing increase to accordingly increase the cooling capacity in the casing. This however may result in the motor apparatus, i.e., the power conversion apparatus, becoming oversized. This therefore may deteriorate the installability of the power conversion apparatus.

In view of the circumstances set forth above, one aspect of the present disclosure seeks to provide power conversion apparatuses, each of which has a smaller size and a higher cooling capability with superior installability.

An exemplary measure of the present disclosure provides a power conversion apparatus. The power conversion apparatus includes a power converter that includes a plurality of switches, a control-circuit unit configured to control the power converter, and a casing that has an outer periphery and houses the power converter and the control-circuit unit therein. The power conversion apparatus includes a cooling passage assembly that includes at least one intra-casing cooling passage (30) through which a coolant for cooling at least the power converter flows. The at least one intra-casing cooling passage is arranged in the casing. The cooling passage also includes at least one extra-casing cooling passage communicating with the at least one intra-casing cooling passage and drawn out from an inside of the casing. The at least one extra-casing cooling passage is disposed not to be in contact to the outer periphery of the casing. The power conversion apparatus includes at least one pump mounted communicably at an arbitrary location of the cooling passage assembly and configured to cause the coolant to flow through the cooling passage assembly. The power conversion apparatus includes a heat exchanger mounted integrally to the outer periphery of the casing and configured to dissipate heat of the coolant flowing through the at least one extra-casing cooling passage to an outside of the power conversion apparatus. The power converter is arranged to be cooled by the coolant flowing through the at least one intra-casing cooling passage, and the heat exchanger and the casing are arranged to be subjected to cooling air, resulting in the heat exchanger and the casing being cooled by the cooling air.

The power conversion apparatus of the exemplary aspect is configured such that the coolant flowing through the at least one intra-casing cooling passage absorbs heat from the power converter, which produces a relatively large amount of heat, resulting in the absorbed heat being dissipated to the outside of the power conversion apparatus in the at least one extra-casing cooling passage.

This reduces an increase in temperature of the whole of the casing due to heat of the coolant flowing through the at least one intra-casing cooling passage.

Additionally, the at least one extra-casing cooling passage is disposed not to be in contact to, i.e., separate from, the outer periphery of the casing. This enables heat transfer from the coolant, which has a high temperature, flowing through the cooling passage assembly to the inside of the casing through the outer periphery of the casing, making it possible to curb an increase in temperature of the inner space 19 of the casing, thus curbing an increase in temperature of the whole of the casing.

Additionally, the power conversion apparatus of the exemplary aspect is configured such that the cooling air cools the casing to accordingly dissipate heat of the control-circuit unit, which produces a relatively low amount of heat.

The heat exchanger, which is mounted integrally to the casing, eliminates the need of providing a housing and connection cables, which are required to hold the heat exchanger away from the casing. This therefore offers the power conversion apparatus, which has a smaller size, a higher cooling capability, and superior installability.

BRIEF DESCRIPTION OF THE DRAWINGS

The above object, other objects, characteristics, and advantageous benefits of the present disclosure will become apparent from the following description with reference to the accompanying drawings in which.

DETAILED DESCRIPTION

The following describes exemplary embodiments with reference to accompanying drawings.

First Embodiment

A1 Configuration of Power Conversion Apparatus

Figure 1:
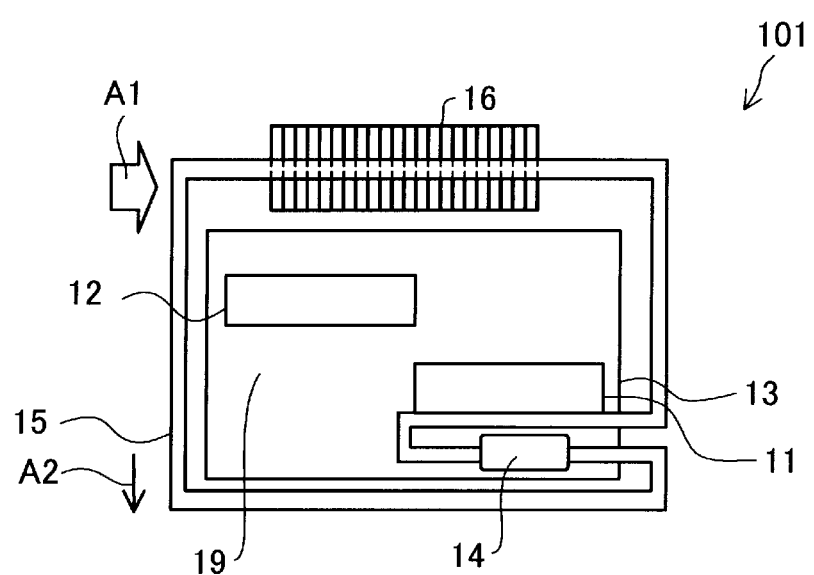
FIG. 1 is a block diagram illustrating a functional configuration of a power conversion apparatus according to the first embodiment of the present disclosure.
Figure 2:
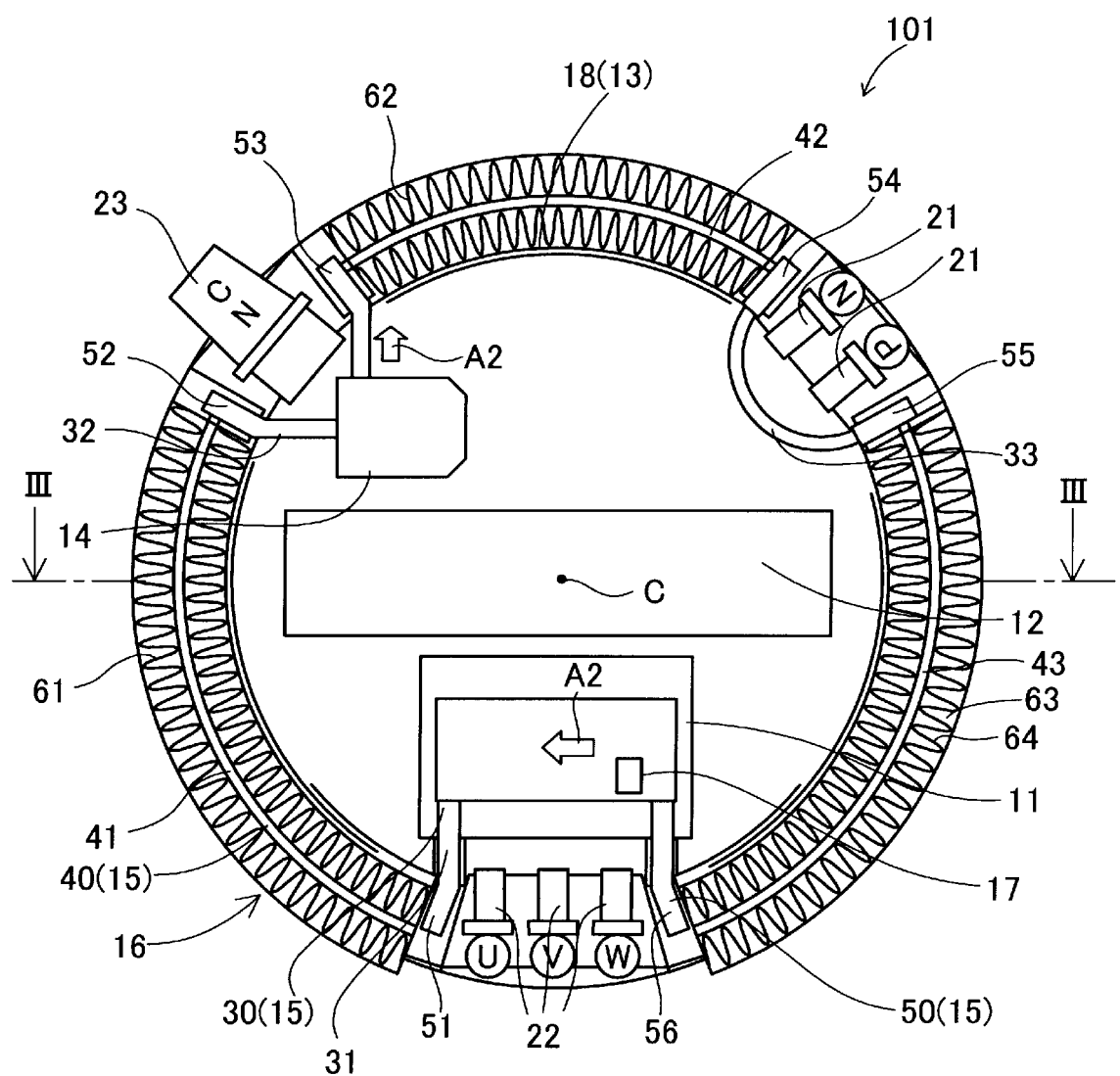
FIG. 2 is a plan view schematically illustrating a diagrammatic configuration of the power conversion apparatus of the first embodiment.
Figure 3:
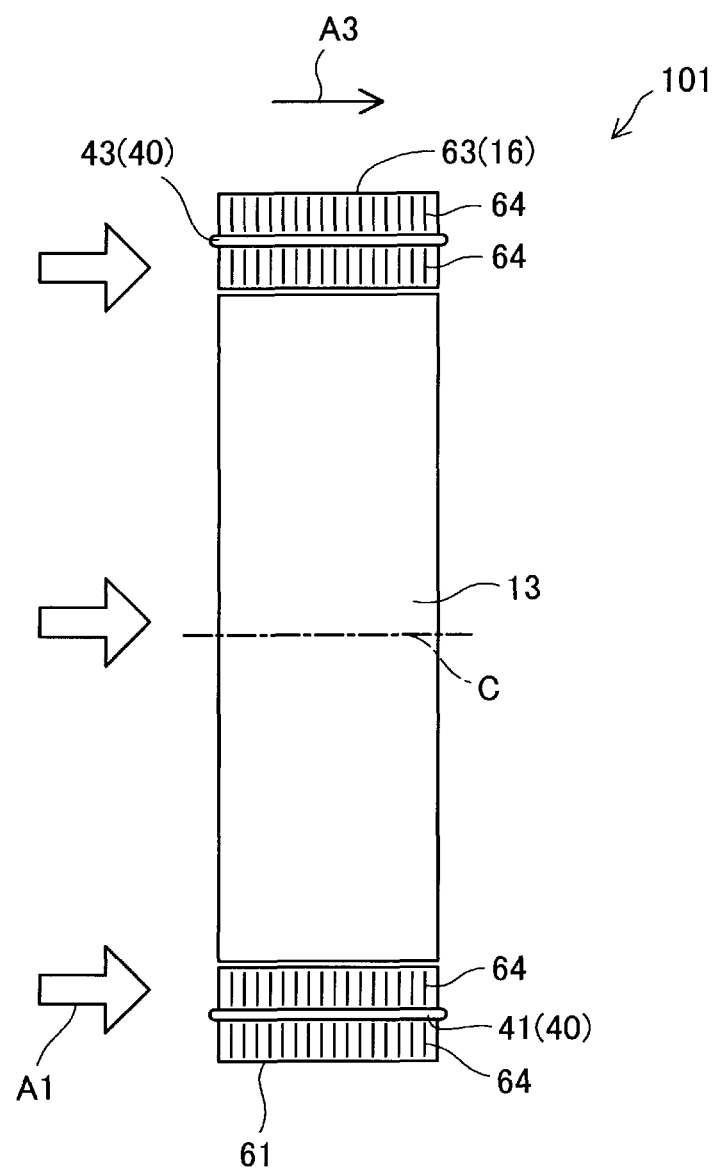
FIG. 3 is a cross-sectional view taken along line III-III in FIG. 2, which schematically illustrates a diagrammatic configuration of the power conversion apparatus of the first embodiment.

The following describes the configuration of a power conversion apparatus 101 according to the first embodiment with reference to FIGS. 1 to 3.

The power conversion apparatus 101 of the first embodiment is connected to a vehicular motor device, and is configured to generate alternating-current (AC) power for driving the motor device. The power conversion apparatus 101 and the motor device are installable in a vehicle equipped with an electric motor, such as an electric vehicle or a hybrid vehicle. The power conversion apparatus 101 operates based on direct-current (DC) power of a battery as a power source, converts the DC power into AC power for driving the motor device, and supplies the AC power to the motor device.

The power conversion apparatus 101 includes, as illustrated in FIG. 1, a power converter 11, a control-circuit unit 12, a single casing 13, a pump 14, a cooling passage assembly 15, and a heat exchanger 16.

The power converter 11 is comprised of a plurality of switches 17 (see FIG. 2), such as Insulated Gate Bipolar Transistors (IGBTs) or Sic-MOSFETs. The control-circuit unit 12 is configured as a control board for controlling on-off switching operations of the switches 17 of the power converter 11 to accordingly convert DC power of the battery into AC power. Because the switches 17 of the power converter 11 generate heat when controlled by the control-circuit unit 12, the power converter 11 can be regarded as a heat generator.

The following describes a specific configuration of the power conversion apparatus 101 with reference to FIGS. 2 and 3. In FIG. 2, a top member of the casing 13 has been omitted in order to clearly illustrate the internal configuration of the power conversion apparatus 101. Each component of the power conversion apparatus 101 disposed in an inner space 19 of the casing 13 is illustrated by solid line in FIG. 2. The casing 13 has an actually sealed structure described later. In the present specification, a direction perpendicular to the plane of FIG. 2 is defined as a vertical direction. One side of the vertical direction, which goes into the plane of FIG. 2, is defined as a lower side, and the other side of the vertical direction, which goes away from the plane of FIG. 2 is defined as an upper side.

The casing 13 is, as illustrated in FIGS. 2 and 3, a tubular cylindrical member that has a tubular cylindrical configuration. The casing 13 has a center axis C extending in the vertical direction in FIG. 2, and extending in a right-and-left direction in FIG. 3. Any views of the power conversion apparatus 101 as seen from the upper side of the center axis C will be defined as top plan views.

The casing 13 has a sealed structure, and has the enclosed inner space 19. Specifically, the casing 13 houses, in the enclosed inner space 19, the power converter 11, the control-circuit unit 12, and the pump 14. That is, the power converter 11 and the control-circuit unit 12 are installed in the same sealed inner space 19. An unillustrated capacitor unit is installed in the casing 13. The capacitor unit is provided in an electric circuit connecting between the battery and the power converter 11, and configured to smooth the DC power supplied from the battery.

The casing 13 has an outer periphery 18. The power conversion apparatus 101 includes main-power input terminals 21, motor connection terminals 22, and a connection connector 23. The main-power input terminal 21, motor connection terminals 22, and connection connector 23 are formed through the casing 13 to protrude, from the outer periphery 18 of the casing 13, radially outward. The first location of the set of the main-power input terminals 21 on the casing 13, the second location of the set of the motor connection terminals 22 on the casing 13, and the third location of the connection connector 23 on the casing 13 substantially partition the casing 13 into three equal casing segments. The set of the main-power input terminals 21, the set of the motor connection terminals 22, and the connection connector 23 are arranged in this order in the clockwise direction in planar view. The motor connection terminals 22 are connected to a three-phase motor. The connection connector 23 serves as a connector unit that enables the control-circuit unit 12 to operate, and is connected to one or more communication cables extending from an unillustrated control apparatus.

The power converter 11 is arranged in the casing 13 adjacent to a predetermined portion of the casing 13; the motor connection terminals 22 are formed through the predetermined portion of the casing 13. The pump 14 is arranged in the casing 13 adjacent to a predetermined portion of the casing 13; the connection connector 23 is formed through the predetermined portion of the casing 13. This arrangement of the pump 14 enables the pump 14 to be separate from the power converter 11 that is regarded as a high heat-generating component.

The pump 14 is configured to pump from a part of the cooling passage assembly 15 into another part of the cooling passage assembly in the direction of arrow A2 to accordingly cause the coolant to flow through first to third external passages 41 to 43 described later.

The cooling passage assembly 15 is a closed circulating flow passage through which the coolant for cooling the power converter 11 flows. For example, water or antifreeze can be used for the coolant.

The cooling passage assembly 15 includes intra-casing cooing passages 30, extra-casing cooling passages 40, and connecting flow passages 50 that are circularly joined to constitute the cooling passage assembly 15.

The intra-casing cooling passages 30 include a first internal passage 31, a second internal passage 32, and a third internal passage 33. The extra-casing cooling passages 40 include the first external passage 41, the second external passage 42, and the third external passage 43.

The connecting flow passages 50 include a first joint passage 51, a second joint passage 52, a third joint passage 53, a fourth joint passage 54, a fifth joint passage 55, and a sixth joint passage 56.

Hereinafter, if there is no need of individually describing the first, second, and third external passages 41, 42, and 43, the first, second, and third external passages 41, 42, and 43 will be collectively described as the extra-casing passages 40. Similarly, if there is no need of individually describing the first, second, and third internal passages 31, 32, and 33, the first, second, and third internal passages 31, 32, and 33 will be collectively described as the intra-casing passages 30. Additionally, if there is no need of individually describing the first to sixth joint passages 51 to 56, the first to sixth joint passages 51 to 56 will be collectively described as the connecting flow passages 50.

The first internal passage 31, the first joint passage 51, the first external passage 41, the second joint passage 52, the second internal passage 32, the third joint passage 53, the second external passage 42, the fourth joint passage 54, the third internal passage 33, the fifth joint passage 55, the third external passage 43, and the sixth joint passage 56 are connected in this order in the clockwise direction in planar view. The assembly of the connected passages 31, 51, 41, 52, 32, 53, 42, 54, 33, 55, 43, and 56 has a substantially ring configuration.

The intra-casing cooling passages 30 are arranged in the casing 13 to be adjacent to the top member of the casing 13.

The first internal passage 31 is disposed in the casing 13 to bypass the motor connection terminals 22. A portion of the first internal passage 31 is in contact with the power converter 11 through an unillustrated insulating plate. The coolant flowing through the first internal passage 31 absorbs heat generated from the power converter 11 to accordingly cool the power converter 11.

The second internal passage 32 is disposed in the casing 13 to bypass the connection connector 23. The pump 14 is communicably mounted at any location of the second internal passage 32.

The third internal passage 33 is disposed in the casing 13 to bypass the power input terminals 21.

The intra-casing cooling passages 30, which are disposed in the casing 13, can be mounted on an inner surface of the casing 13 or disposed away from the inner surface of the casing 13.

The connecting flow passages 50 are located at the outside of the casing 13. Each joint flow passage 50 joins a corresponding one of the intra-casing cooling passages 30 and a corresponding one of the extra-casing cooling passages 40. The connecting flow passages 50 are disposed to protrude, through an outer circumference of the top member of the casing 13, radially outward.

Each of the extra-casing cooling passages 40 communicates with a corresponding pair of intra-casing passages 30 through a corresponding pair of connecting flow passages 50, and is drawn out from the inside of the casing 13 to the outside thereof.

Specifically, each of the first to third external passages 41 to 43 has opposing upstream and downstream ends. The upstream end of the first external passage 41 is joined to the first internal passage 31 through the first joint passage 51, and the downstream end of the first external passage 41 is joined to the second internal passage 32 through the second joint passage 52. Similarly, the upstream end of the second external passage 42 is joined to the second internal passage 32 through the third joint passage 53, and the downstream end of the second external passage 42 is joined to the third internal passage 33 through the fourth joint passage 54. Additionally, the upstream end of the third external passage 43 is joined to the third internal passage 33 through the fifth joint passage 55, and the downstream end of the third external passage 43 is joined to the first internal passage 31 through the sixth joint passage 56. The extra-casing cooling passages 40 are disposed not to be in contact to the outer periphery 18 of the casing 13, i.e., disposed away from the outer periphery 18 of the casing 13.

Each of the extra-casing cooling passages 40 has a cross-section along a virtual plane including the center axis C of the casing 13; the cross-section of each of the extra-casing cooling passages 40 has a flat shape (see FIG. 3). The cross-section of each of the extra-casing cooling passages 40 has a predetermined first length in the axial direction of the casing 13, and a predetermined second length in a radial direction of the casing 13; the first length is set to be three times or more the second length. Each of the extra-casing cooling passages 40 has a predetermined width in the vertical direction, which corresponds to a length thereof in the right-and-left direction in FIG. 3, and the width of each of the extra-casing cooling passages 40 is set to be substantially identical to the axial length of the casing 13. Each of the extra-casing cooling passages 40 is comprised of a metallic flat tubular plate, and includes one or more unillustrated inner fins formed thereinside.

Each of the first to third external passages 41 to 43 has a substantially circular-arc shape in planar view. Each of the circular-arc shaped external passages 41 to 43 has a center angle that substantially lies within the range from 80° to 100° inclusive. Each of the first to third external passages 41 to 43 is arranged to face a corresponding portion of the outer periphery 18 of the casing 13 with a predetermined distance to the outer periphery 18 thereof while extending along the corresponding portion of the outer periphery 18. The extra-casing cooling passages 40 are disposed to bypass the respective terminals 21, 22, and 23, and the assembly of the extra-casing cooling passages 40 has a substantially annular ring shape.

Each adjacent joint pair of these passages 31, 32, 33, 41, 42, 43, 51, 52, 53, 54, 55, and 56 of the cooling passage assembly 15 have a joint boundary therebetween, and the joint boundary of each adjacent joint pair of these passages 31, 32, 33, 41, 42, 43, 51, 52, 53, 54, 55, and 56 of the cooling passage assembly 15 has smoothly curved corners. The smoothly curved corners of the joint boundary of each adjacent joint pair of these passages 31, 32, 33, 41, 42, 43, 51, 52, 53, 54, 55, and 56 of the cooling passage assembly 15 enables pressure drop across the corresponding adjacent joint pair of these passages 32, 33, 41, 42, 43, 51, 52, 53, 54, 55, and 56 to be reduced.

The heat exchanger 16 is arranged to surround the outer periphery 18 of the casing 13 while being mounted integrally to the casing 13.

The heat exchanger 16 includes a first heat dissipator 61, a second heat dissipator 62, and a third heat dissipator 63. The first heat dissipator 61 is provided for the first external passage 41, the second heat dissipator 62 is provided for the second external passage 42, and the third heat dissipator 63 is provided for the third external passage 43. That is, the first to third heat dissipators 61 to 63 of the heat exchanger 16 are arranged in a substantially annular ring shape.

Each of the first to third heat dissipators 61, 62, and 63 includes, for example, corrugated fins 64; each of the corrugated fins 64 serves as a heat dissipation fin.

Each of the corrugated fins 64 extends in a wavelike fashion in the circumferential direction of the casing 13. The corrugated fins 64 provided for the first external passage 41 are arranged on both radial sides of the first external passage 41 along a cross-section perpendicular to the axial direction of the casing 13 (see FIG. 3). Similarly, the corrugated fins 64 provided for the second external passage 42 are arranged on both radial sides of the second external passage 42 along the cross-section perpendicular to the axial direction of the casing 13 (see FIG. 3), and the corrugated fins 64 provided for the third external passage 43 are arranged on both radial sides of the third external passage 43 along the cross-section perpendicular to the axial direction of the casing 13 (see FIG. 3).

Specifically, one of the first corrugated fins 64 provided for the first external passage 41 is arranged radially inside the first external passage 41, and the other of the first corrugated fins 64 provided for the first external passage 41 is arranged radially outside the first external passage 41. Similarly, one of the second corrugated fins 64 provided for the second external passage 42 is arranged radially inside the second external passage 42, and the other of the second corrugated fins 64 provided for the second external passage 42 is arranged radially outside the second external passage 42. Additionally, one of the third corrugated fins 64 provided for the third external passage 43 is arranged radially inside the third external passage 43, and the other of the third corrugated fins 64 provided for the third external passage 43 is arranged radially outside the third external passage 43.

The power conversion apparatus 101 is located in a predetermined space of the vehicle; cooling air is supplied to the space in the vehicle by an unillustrated air blower installed in the vehicle. This results in the power conversion apparatus 101 being subjected to the cooling air flowing in the axial direction of the casing 13 (see the arrows A1 illustrated in FIGS. 1 and 3). That is, the cooling air partly flows along the outer periphery 18 of the casing 13 in the axial direction of the casing 13. This results in the cooling air partly passing through each of the corrugated fins 64 in the axial direction of the casing 13. The corrugated fin 64 provided for each external passage 41, 42, 43 can be arranged for one side of the corresponding external passage 41, 42, 43.

The cooling air partly hits the casing 13 itself in addition to the heat exchanger 16. That is, the cooling air partly passes through the annularly arranged heat dissipators 61 to 63 around the casing 13 while passing through the casing 13 itself and passing through portions of the power conversion apparatus 101 around the casing 13; no heat dissipators are provided in the respective portions of the power conversion apparatus 101. In other words, the power conversion apparatus 101 is arranged such that the cooling air partly passes through the annularly arranged heat dissipators 61 to 63 around the casing 13 while passing through the casing 13 itself and passing through portions of the power conversion apparatus 101 around the casing 13; no heat dissipators are provided in the respective portions of the power conversion apparatus 101.

This therefore results in both the heat exchanger 16 and the casing 13, which are integrated with one another, being simultaneously subjected to the cooling air. The heat exchanger 16 receives heat from the coolant flowing through the extra-casing cooling passages 40, and dissipates, as illustrated by an arrow A3 in FIG. 3, the received heat to the outside of the power conversion apparatus 101. The corrugated fins 64 enable contact areas of the corrugated fins 64 with respect to the cooling air to be sufficiently ensured, resulting in heat exchange between the coolant and the cooling air being efficiently carried out.

A2 Cooling Operation in Power Conversion Apparatus 101

The following describes how cooling operations are carried out in the power conversion apparatus 101.

Heat generated in the power converter 11 is received by the coolant flowing through the first internal passage 31 located adjacently below the power converter 11. This enables the power converter 11, whose temperature for example has risen up to 150° C., to be cooled, resulting in the temperature of the power converter 11 decreasing down to a desired specific low temperature of, for example, 50° C. The coolant, whose temperature has risen up to 100° C. or thereabout, flows through the first to third external passages 41 to 43 back to the first internal passage 31 while heat of the coolant is dissipated by the heat exchanger 16. This results in the temperature of the coolant decreasing down to 50° C. or thereabout.

The whole of the casing 13 is subjected to the cooling air, so that the whole of the casing 13 is cooled. Specifically, heat of the control-circuit unit 12 is dissipated from the outer surfaces of the casing 13, resulting in the temperature of the control-circuit unit 12 decreasing down to a desired specific low temperature. Separately arranging the extra-casing cooling passages 40 from the outer periphery 18 of the casing 13 enables heat transfer from the coolant, which has a high temperature, to the casing 13 through the extra-casing cooling passages to be restricted. Cooling the outer surfaces of the casing 13 by the cooling air enables the temperature in the casing 13 to be lower than the temperature of the coolant.

The situation where the power converter 11 is cooled represents a situation where the temperature of the power converter 11, which is subjected to heat exchange between the power converter 11 and the coolant flowing through the extra-casing cooling passages 40, becomes lower than the temperature of the power converter 11, which is not subjected to heat exchange between the power converter 11 and the coolant flowing through the extra-casing cooling passages 40. For this reason, the situation where the power converter 11 is cooled can include (I) A first situation where heat exchange between the power converter 11 and the coolant flowing through the extra-casing cooling passages 40 results in the temperature of the power converter 11 reducing (II) A second situation where heat exchange between the power converter 11 and the coolant flowing through the extra-casing cooling passages 40 results in the temperature of the power converter 11 being maintained, i.e., unchanged (III) A third situation where heat exchange between the power converter 11 and the coolant flowing through the extra-casing cooling passages 40 results in the temperature of the power converter 11 increasing The following describes advantageous benefits achieved by the first embodiment.

A larger amount of heat given off by the power converter 101 due to the supply of a high current thereto from the battery causes the temperature of the power converter 11 included in all the components of the power conversion apparatus 101 to be likely to increase up to a high temperature of, for example, 150° C. or more.

From this viewpoint, the power conversion apparatus 101 of the first embodiment is configured such that (I) The coolant flowing through the cooling passage assembly 15 dissipates heat of the power converter 11, which produces a relatively large amount of heat (II) The cooling air supplied from the air blower cools the casing 13 to accordingly dissipate heat of the control-circuit unit 12, which produces a relatively low amount of heat The power conversion apparatus 101 is additionally configured such that the cooling air supplied from the air blower cools the whole of the heat exchanger 16 and the casing 13.

Separately arranging the extra-casing cooling passages 40 from the outer surfaces of the casing 13 enables heat transfer from the coolant, which has a high temperature, to the casing 13 through the extra-casing cooling passages 40 to be restricted to be as low as possible, making it possible to curb an increase in temperature of the inner space 19 of the casing 13.

The heat exchanger 16, which is integrated with the casing 13, eliminates the need of providing a housing and connection cables, which are required to hold the heat exchanger 16 away from the casing 13. This therefore offers the power conversion apparatus 101, which has a smaller size, a higher cooling capability, and superior installability.

The pump 14 is communicably mounted at any location of one of the intra-casing cooling passage 30, i.e., the second internal passage 32, and installed in the casing 13. This configuration enables the length of a passage required for joint of the pump 14 to be as short as possible, making it possible to minimize the volume and weight of the coolant. This configuration additionally eliminates the need of external joint members, making it possible to simplify the overall configuration of the power conversion apparatus 101, facilitate replacement of the power conversion apparatus 101, and improve the maintainability of the power conversion apparatus 101.

The casing 13 has a sealed structure, and the heat exchanger 16 is mounted integrally to the outer periphery 18 of the casing 13.

For example, let us consider a comparative example of an electronic device, which includes a cooling apparatus, disclosed in Japanese Patent Application Publication No. 2007-294655. The electronic device of the comparative example is configured to introduce outside air thereinto, and dissipate heat from a heat-generating component in the electronic device. This may result in water drops and/or foreign particles entering inside of the electronic device. In particular, if such an electronic device is a high-voltage electronic device, the entry of water drops and/or foreign particles into the high-voltage electronic device may deteriorate the electric-isolation performance of the high-voltage electronic device, and the deterioration in electric-isolation performance of the high-voltage electronic device may cause a risk of damage to the high-voltage electronic device.

From this viewpoint, the configuration of the power conversion apparatus 1 according to the first embodiment is configured to perform heat dissipation in the casing 13 without introducing outside air into the casing 13. This configuration therefore prevents damage to the high-voltage power conversion apparatus 101, which includes the casing 13 having a sealed structure and a waterproof structure, due to entry of water and/or foreign particles into the casing 13.

Second Embodiment

Figure 4:
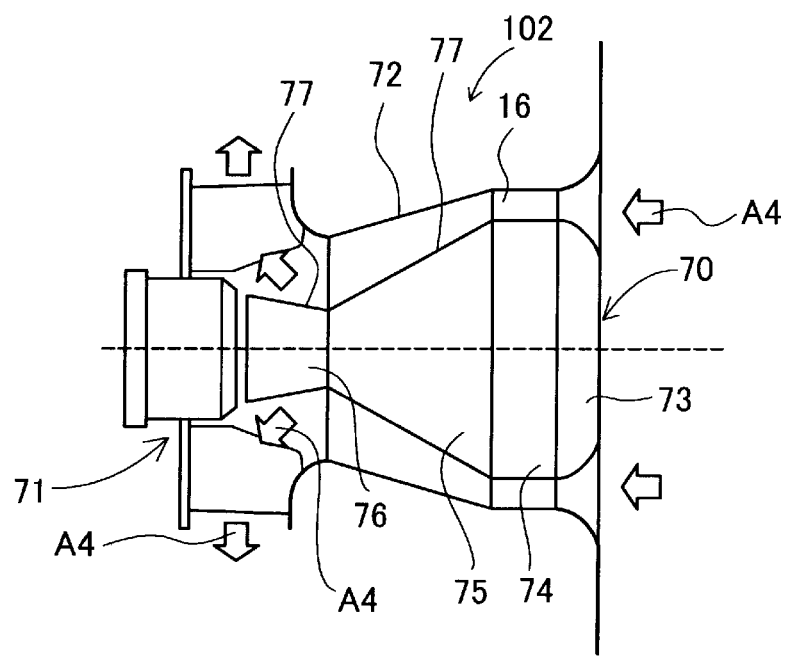
FIG. 4 is a side view schematically illustrating a diagrammatic configuration of a power conversion apparatus according to the second embodiment of the present disclosure.

The following describes a power conversion apparatus 102 according to the second embodiment with reference to FIG. 4. In the first and second embodiments, descriptions of like parts between the first and second embodiments, to which like reference characters are assigned, are omitted or simplified to avoid redundant description.

Because the configuration of a casing 70 of the power conversion apparatus 102 is mainly different from that of the casing 13 of the power conversion apparatus 101, FIG. 4 illustrates mainly the casing 70 and the heat exchanger 16 while eliminating illustration of the detailed structure of the other components.

The power conversion apparatus 102 of the second embodiment is, as illustrated in FIG. 4, installed in a duct 72 to be subjected to cooling air created in the duct 72 by a centrifugal fan 71 serving as an air blower. The casing 70 of the second embodiment has an outer periphery that is in conformity with an inner periphery of the duct 72. In other words, the casing 70 has the outer periphery that is shaped to be along the flow of the cooling air illustrated by arrows A4 in FIG. 4.

Specifically, the casing 70 is comprised of a cylindrical bottom 73, a cylindrical tubular wall 74, a first tubular truncated cone wall 75, and a second tubular truncated cone wall 76 that are coaxially aligned in a predetermined axial direction. The heat exchanger 16 is arranged to surround the outer periphery of the cylindrical tubular wall 74. That is, the cylindrical tubular wall 74 of the casing 70 corresponds to the casing 13 of the first embodiment, and therefore, the configuration of the cylindrical tubular wall 74 is substantially identical to the configuration of the casing 13 of the first embodiment.

The first tubular truncated cone wall 75 is tapered along the flow of the cooling air from the right to the left in FIG. 4. In contrast, the second tubular truncated cone wall 76 is configured such that the diameter thereof becomes larger along the flow of the cooling air from the right to the left in FIG. 4. An outer periphery of the first tubular truncated cone wall 75, which extends adjacently along the inner periphery of the duct 72 in the axial direction, serves as a pressure-loss reducing portion 77.

Specifically, the radial dimension of the pressure-loss reducing portion 77 of the casing 70 becomes smaller as the pressure-loss reducing portion 77 recedes away from the extra-casing cooling passages located inside the heat exchanger 16. In other words, the radial dimension of the pressure-loss reducing portion 77 of the casing 70 becomes smaller toward the downstream of the cooling-air flow. The duct 72 has an inlet from which the cooling air is introduced thereinto, and an unillustrated filter or an unillustrated centrifugal separator is installed in the inlet of the duct 72. The unillustrated filter or centrifugal separator removes, from the cooling air, dirt and/or dust contained in the cooling air to accordingly prevent clogging of passages defined by the fins of the heat exchanger 16.

The power conversion apparatus 102 of the second embodiment achieves advantages benefits that are substantially identical to those achieved by the power conversion apparatus 101 of the first embodiment.

Additionally, the casing 70 of the power conversion apparatus 102 includes the pressure-loss reducing portion 77 that is shaped to reduce pressure loss of the cooling air. This efficiently uses the cooling air to cool the heat exchanger 16, making it possible to improve the cooling capability of the power conversion apparatus 102.

Modifications

A wind tunnel formed between the inner periphery of a duct in which the power converter 101 of the first embodiment is installed and the outer periphery of the casing 13 can be configured to increase the flow rate of the cooling air that hits a portion of the heat exchanger 16 adjacent to the power converter 11, i.e., a portion of the first heat dissipator 61 adjacent to the upstream of the first external passage 41.

Similarly, a wind tunnel formed between the inner periphery of the duct 72 in which the power converter 102 of the second embodiment is installed and the outer periphery of the casing 70 can be configured to increase the flow rate of the cooling air that hits a portion of the heat exchanger 16 adjacent to the power converter 11, i.e., a portion of the first heat dissipator 61 adjacent to the upstream of the first external passage 41.

The above modification of each of the first and second embodiments enables the cooling air to efficiently hit the portion of the heat exchanger 16, which is adjacent to the power converter 11, making it possible to increase the cooling capability of the portion of the heat exchanger 16, the temperature of the coolant that is flowing through the portion of the heat exchanger 16 may be particularly high.

Like the second embodiment, the longitudinal cross-section of the casing 13 can be configured such that the outer periphery 18 of the casing 13 is shaped to be along the inner periphery of the duct in which the power conversion apparatus 101 is installed. This modification enables the casing 13 of the power conversion apparatus 101 to include the pressure-loss reducing portion 77, making it possible to efficiently use the high-speed flow of the cooling air generated adjacent to the power converter 11.

Each of the extra-casing cooling passages 40 according to each of the first and second embodiments can be comprised of, for example, a circular pipe that has a circular cross-section.

Figure 5:
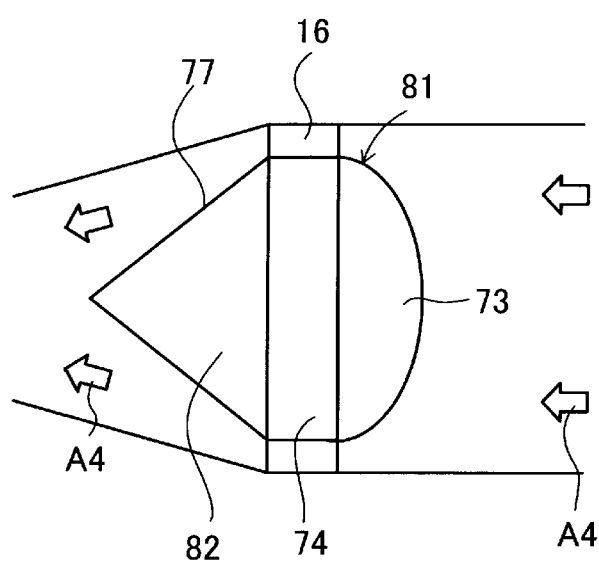
FIG. 5 is a side view schematically illustrating a diagrammatic configuration of a power conversion apparatus according to one modification of the second embodiment of the present disclosure.

The casing 70 of the second embodiment, which has the first tubular truncated cone wall 75 and second tubular truncated cone wall 76, can be modified to have another configuration, such as a circular cone wall or a streamlined wall, as long as the modified configuration of the casing 70 reduces the pressure loss of the cooling air. For example, as illustrated in FIG. 5, a modified casing 81 can include a circular cone wall 82 in place of the first and second tubular truncated cone walls 75 and 76.

Figure 6:
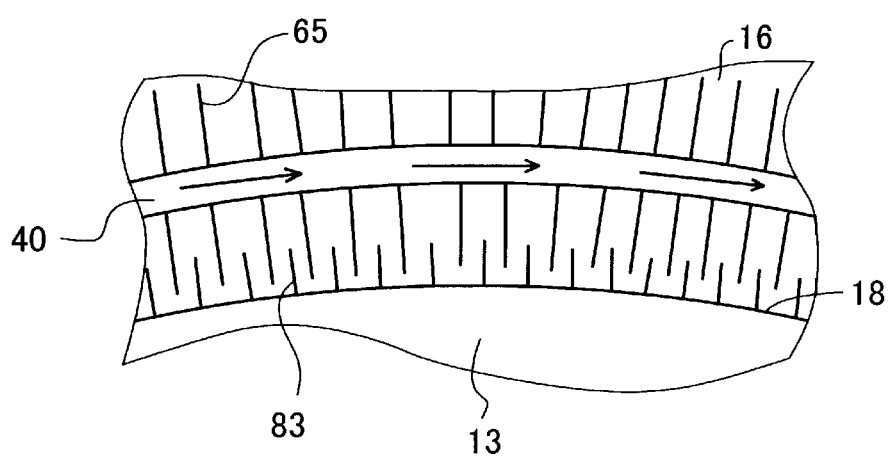
FIG. 6 is a plan view schematically illustrating a part of a power conversion apparatus according to an additional modification of each embodiment of the present disclosure.

Each of the power conversion apparatuses 101 and 102 of the first and second embodiments can include, as illustrated in FIG. 6, fins 83 mounted on the outer periphery of the casing 13, 70. This facilitates heat dissipation of the casing 13, 70, making it possible to further improve the cooling capability of each of the power conversion apparatuses 101 and 102 of the first and second embodiments. As illustrated in FIG. 6, each of the first to third heat dissipators 61, 62, and 63 can include straight fins 65 in place of the corrugated fins 64.

Each of the power conversion apparatuses 101 and 102 of the first and second embodiments is configured such that both the heat exchanger 16 and the casing 13, 70 are subjected to the cooling air, but can be configured such that only the heat exchanger 16 disposed to surround the outer periphery of the casing 13, 70 is subjected to the cooling air.

If the vehicle or another mobility device in which the power conversion apparatus 101 or 102 is to be installed moves at high velocity, the power conversion apparatus 101 or 102 can be configured to be subjected to self-produced air. Such a natural-cooling power conversion apparatus 101 or 102 can eliminate air blowers, such as fans.

Each of the power conversion apparatuses 101 and 102 can include plural pumps 14 and fans. The location of one or more pumps 14 can be changed.

Each of the power conversion apparatuses 101 and 102 of the first and second embodiments is connected to a vehicular motor device, and is installable in a vehicle. Each of the power conversion apparatuses 101 and 102 of the first and second embodiments can be installable in an electric train, an aircraft, or a ship. Each of the power conversion apparatuses 101 and 102 of the first and second embodiments can be applied as an electronic device with a cooling function, such as personal computer or a gaming device, as long as the power converter 11 serves as a heat-generating processor.

The casing 13 of the first embodiment, which has a tubular cylindrical shape, but can have any shape. The heat exchanger 16 is configured to include the first to third heat dissipators 61 to 63, but the present disclosure is not limited to this configuration. Specifically, the heat exchanger 16 according to the present disclosure can include one or more heat dissipators whose shapes are freely changed as long as the one or more heat dissipators are mounted integrally to the outer periphery of the casing 13.

The density of the fins provided in one portion of the heat exchanger 16 can be changed as compared with the density of the fins provided in another portion of the heat exchanger 16. For example, the density of the fins provided in the first heat dissipator 61 can be changed as compared with the density of the fins provided in each of the other second and third heat dissipators 62 and 63 such that the interval of each adjacent pair of fins provided in the first heat dissipator 61 is wider, resulting in the volume of the cooling air therethrough being greater.

While the illustrative embodiments of the present disclosure have been described herein, the present disclosure is not limited to the embodiments and their modifications described herein, can be implemented by one of various configurations within the scope of the present disclosure.

The present disclosure can include replacement of one or more technical features included in one of the embodiments, which correspond to one or more technical features described in the summary of the invention, with one or more new technical features in order to address a part or all of the above issues or achieve a part or all of the above advantageous benefits. The present disclosure can include combination of one or more technical features included in one of the embodiments, which correspond to one or more technical features described in the summary of the invention, in order to address a part or all of the above issues or achieve a part or all of the above advantageous benefits. One or more technical features, which have not been described as essential features, can be deleted as necessity arises.

The following describes an electronic device (101) that includes a heat-generating portion (11), a sealed casing (13), a cooling passage (15), at least one pump (14), and a heat exchanger (16). The heat-generating portion is installed in the sealed casing. The at least one pump is configured to cause a coolant for cooling the heat-generating portion to flow through the cooling passage.

In particular, the sealed casing has an outer periphery, and the cooling passage includes an extra-casing passage. The heat exchanger is mounted integrally to the outer periphery of the casing, and is configured to dissipate heat received by the coolant flowing through the extra-casing passage to an outside of the electronic device.

The electronic device is configured such that the heat-generating portion is cooled by the coolant flowing through the cooling passage, and the heat exchanger and the casing are cooled by cooling air.

The invention claimed is:

1. A power conversion apparatus comprising:
   a power converter that includes a plurality of switches;
   a control-circuit unit configured to control the power converter;
   a casing that has an outer periphery and houses the power converter and the control-circuit unit therein;
   a cooling passage assembly including:
      at least one intra-casing cooling passage through which a coolant for cooling at least the power converter flows, the at least one intra-casing cooling passage being arranged in the casing; and
      at least one extra-casing cooling passage communicating with the at least one intra-casing cooling passage and drawn out from an inside of the casing, the at least one extra-casing cooling passage being disposed not to be in contact to the outer periphery of the casing;
   at least one pump mounted communicably at an arbitrary location of the cooling passage assembly and configured to cause the coolant to flow through the cooling passage assembly; and
   a heat exchanger mounted integrally to the outer periphery of the casing and configured to dissipate heat of the coolant flowing through the at least one extra-casing cooling passage to an outside of the power conversion apparatus,
   the power converter being arranged to be cooled by the coolant flowing through the at least one intra-casing cooling passage,
   the heat exchanger and the casing being arranged to be subjected to cooling air, resulting in the heat exchanger and the casing being cooled by the cooling air.

2. The power conversion apparatus according to claim 1, wherein:
   the at least one pump is communicably mounted at the arbitrary location of the at least one intra-casing cooling passage, and is installed in the casing.

3. The power conversion apparatus according to claim 1, wherein:
   the at least one extra-casing cooling passage and the heat exchanger are arranged to surround the casing.

4. The power conversion apparatus according to claim 3, wherein:
   the casing is a tubular cylindrical member, and has a center axis; and
   the at least one extra-casing cooling passage has a cross-section along a virtual plane including the center axis of the casing, the cross-section of the at least one extra-casing cooling passage having a flat shape and extending in the direction of the center axis of the casing.

5. The power conversion apparatus according to claim 4, wherein:
   the heat exchanger includes one or more heat dissipation fins arranged on at least one side of the at least one extra-casing cooling passage along the virtual plane including the center axis of the casing.

6. The power conversion apparatus according to claim 1, wherein:
   the heat exchanger is arranged to be subjected to the cooling air created by an air blower.

7. The power conversion apparatus according to claim 6, wherein:
   the casing is a tubular cylindrical member, and has a center axis; and
   the casing includes a pressure-loss reduction portion configured such that a radial dimension of the pressure-loss reduction portion of the casing becomes smaller as the pressure-loss reduction portion recedes away from the at least one extra-casing cooling passage in a downstream direction of flow of the cooling air.

* * * * *